US012761735B2

(12) United States Patent
Cha et al.

(10) Patent No.: US 12,761,735 B2
(45) Date of Patent: Oct. 13, 2026

(54) VIRTUAL REALITY INTERFACE DEVICE FOR THERMO-TOUCH HAPTIC FEEDBACK

(71) Applicant: KOREA UNIVERSITY RESEARCH AND BUSINESS FOUNDATION, Seoul (KR)

(72) Inventors: Youngsu Cha, Seoul (KR); Seohu Lee, Seoul (KR)

(73) Assignee: KOREA UNIVERSITY RESEARCH AND BUSINESS FOUNDATION, Seoul (KR)

(*) Notice: Subject to any disclaimer, the term of this patent is extended or adjusted under 35 U.S.C. 154(b) by 0 days.

(21) Appl. No.: 19/197,875

(22) Filed: May 2, 2025

(65) Prior Publication Data

US 2026/0086642 A1 Mar. 26, 2026

(30) Foreign Application Priority Data

May 3, 2024 (KR) ........................ 10-2024-0059427

(51) Int. Cl.
*H10N 10/13* (2023.01)
*G06F 3/01* (2006.01)
*H10N 10/17* (2023.01)

(52) U.S. Cl.
CPC .............. *G06F 3/016* (2013.01); *G06F 3/011* (2013.01); *H10N 10/13* (2023.02); *H10N 10/17* (2023.02)

(58) Field of Classification Search
CPC ......... G06F 3/016; G06F 3/011; H10N 10/13; H10N 10/17
See application file for complete search history.

(56) References Cited

U.S. PATENT DOCUMENTS 11,609,636 B2 * 3/2023 Nieman .................. G06F 3/014
12,533,576 B2 * 1/2026 Aurongzeb ........... A63F 13/285
(Continued)

FOREIGN PATENT DOCUMENTS

CN 114942694 A * 8/2022 ............. G06F 3/014
KR 10-1873402 B1 7/2018
(Continued)

OTHER PUBLICATIONS

CN-114942694-A English Translation, Wang, Aug. 26, 2022.*
(Continued)

*Primary Examiner* — Jeff Piziali
(74) *Attorney, Agent, or Firm* — BROADVIEW IP LAW, PC

(57) ABSTRACT

Disclosed are a haptic feedback device and a virtual reality (VR) interface device for simultaneously providing thermo-touch haptic feedback. The haptic feedback device includes a thermal sensation providing unit configured to provide a thermal sensation to a user; a touch sensation providing unit configured to provide a touch sensation to the user; and a fixing device configured to fix at least a portion of the thermal sensation providing unit and at least a portion of the touch sensation providing unit, the thermal sensation providing unit includes a substrate; at least one thermoelectric device (TED) formed on the substrate; and a thermal pad formed on the at least one thermoelectric device (TED), and the touch sensation providing unit includes a base with a hole formed; and a film configured to bond to the base and to elongate according to the air pressure provided through the hole.

9 Claims, 8 Drawing Sheets

(56) References Cited

U.S. PATENT DOCUMENTS

| | | | | |
|---|---|---|---|---|
| 2013/0088341 | A1* | 4/2013 | Lim | G06F 3/016<br>340/407.1 |
| 2022/0176240 | A1* | 6/2022 | Aurongzeb | A63F 13/285 |
| 2025/0258547 | A1* | 8/2025 | Lee | G06F 3/016 |

FOREIGN PATENT DOCUMENTS

| | | | |
|---|---|---|---|
| KR | 10-2110879 | B1 | 5/2020 |
| KR | 10-2222633 | B1 | 3/2021 |
| KR | 10-2320078 | B1 | 10/2021 |

OTHER PUBLICATIONS

Kim, Seung-Won et al., "Thermal display glove for interacting with virtual reality", Scientific Reports, Article No. 11403, https://doi.org/10.1038/s41598-020-68362-y, Jul. 2020.

Frediani, Gabriele et al., "Tactile display of softness on fingertip", Scientific Reports, Article No. 20491, https://doi.org/10.1038/s41598-020-77591-0, Nov. 2020.

Lee, Yeonseo et al., "Thermal Feedback System From Robot Hand for Telepresence", IEEE Access, vol. 9, pp. 827-835, DOI: 10.1109/ACCESS.2020.3047036, Dec. 2020.

* cited by examiner

VIRTUAL REALITY INTERFACE DEVICE FOR THERMO-TOUCH HAPTIC FEEDBACK

CROSS-REFERENCE TO RELATED APPLICATION(S)

This application claims the benefit under 35 USC § 119(a) of Korean Patent Application No. 10-2024-0059427 filed on May 3, 2024 in the Korean Intellectual Property Office, the entire disclosure of which is incorporated herein by reference for all purposes.

BACKGROUND

1. Field

The present invention relates to a haptic device that interacts with virtual reality (VR), and more particularly, to an interface device that provides corresponding thermo-touch haptic feedback when a virtual hand and a virtual object physically interact in virtual reality (VR).

2. Description of Related Art

Perception refers to a process of recognizing and interpreting sensation information to understand one's current state or surroundings. Sensations are perceived based on stimuli applied to a sensory receptor, and human sensations are generally divided into five senses: vision, audition, touch, smell, and taste. In addition to vision and audition, touch is also a sensation that has a major impact on perception, particularly, in perceiving the surface property (e.g., temperature, texture, and vibration) of an interacting object.

Due to the importance of this sense of touch, research is being actively conducted to develop a device for artificially generating and providing tactile stimuli, and this field is collectively called haptics. Human touch is divided into force-based haptic feedback corresponding to a mechanoreceptor and heat-based haptic feedback corresponding to a thermoreceptor depending on a type of a sensory receptor in the skin.

Various mechanisms are being used to provide haptic feedback. Among them, a pneumatic-based device for providing force-based haptic feedback and a thermoelectric-based device for providing heat-based haptic feedback are being widely studied.

The pneumatic-based device has advantages of high efficiency, light weight, environmental friendliness, and safety, and are particularly widely applied to a wearable device. In the related conventional Korean Patent Registration No. 1873402, a tactile feedback device based on a pneumatic mechanism with three degrees of freedom is developed and this device provides haptic feedback by controlling the air pressure applied to a moving portion according to an input signal. However, this type of device may only provide force-based haptic feedback. In particular, the conventional haptic feedback device using the air pressure requires a large and noisy pneumatic pump.

Therefore, to develop a more versatile pneumatic-based haptic feedback device, a large pneumatic pump needs to be excluded from a system. To this end, in the conventional Korean Patent Registration No. 2222633, a pump based on an origami (paper folding) structure is developed to solve this issue.

The thermoelectric-based device is being actively applied to a wearable device due to its high energy efficiency and ability to produce a thin and flexible structure. In the related conventional Korean Patent Registration No. 2110879, proposed is a device that may control temperature using a thermoelectric element and this device may quickly control the temperature of the device through the direction of current. However, applying this to the wearable device for providing haptic feedback remains another issue.

With the recent rapid development of virtual reality (VR) technology, various virtual reality (VR) devices are being actively developed for application. Following this research trend, research is also actively being conducted to build an overall interface that links a haptic feedback device with virtual reality. In this regard, Korean Patent Registration No. 2320078 is proposed, which proposes a device that integrates vision and touch through virtual reality.

SUMMARY

A technical subject to be achieved by the present invention is as follows.

When a virtual hand and a virtual object physically interact in virtual reality (VR), haptic feedback corresponding to thermo-touch among corresponding tactile sensations is provided to a real hand. Here, an operating mechanism is based on pneumatic actuation and thermoelectric effect.

Instead of an existing large and noisy pneumatic pump, the air pressure is provided using a small pneumatic pump manufactured based on an origami pattern.

A wearable device is developed using a silicone-based soft material to enhance comfort of wearing.

Haptic feedback corresponding to virtual reality is provided to a user in real time through interaction between virtual reality and a haptic feedback device.

A haptic feedback device according to an example embodiment includes a thermal sensation providing unit configured to provide a thermal sensation to a user; a touch sensation providing unit configured to provide a touch sensation to the user; and a fixing device configured to fix at least a portion of the thermal sensation providing unit and at least a portion of the touch sensation providing unit, the thermal sensation providing unit includes a substrate; at least one thermoelectric device (TED) formed on the substrate; and a thermal pad formed on the at least one thermoelectric device (TED), and the touch sensation providing unit includes a base with a hole formed; and a film configured to bond to the base and to elongate according to the air pressure provided through the hole.

An interface device according to an example embodiment includes the haptic feedback device, a pump configured to provide the air pressure to the touch sensation providing unit of the haptic feedback device; and a control unit configured to output a control signal for controlling the thermal sensation providing unit and a control signal for controlling the pump.

According to some example embodiments, since two types of tactile sensations, heat and touch, are capable of being provided simultaneously, it is possible to enhance the realism of virtual reality.

Also, an end effector that may provide feedback may be made as small and thin as possible using a silicone-based soft material, not to interfere with the dexterity of hand as possible.

The conventional bulky pneumatic pump may be excluded from the system using a small pneumatic pump based on an origami pattern.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
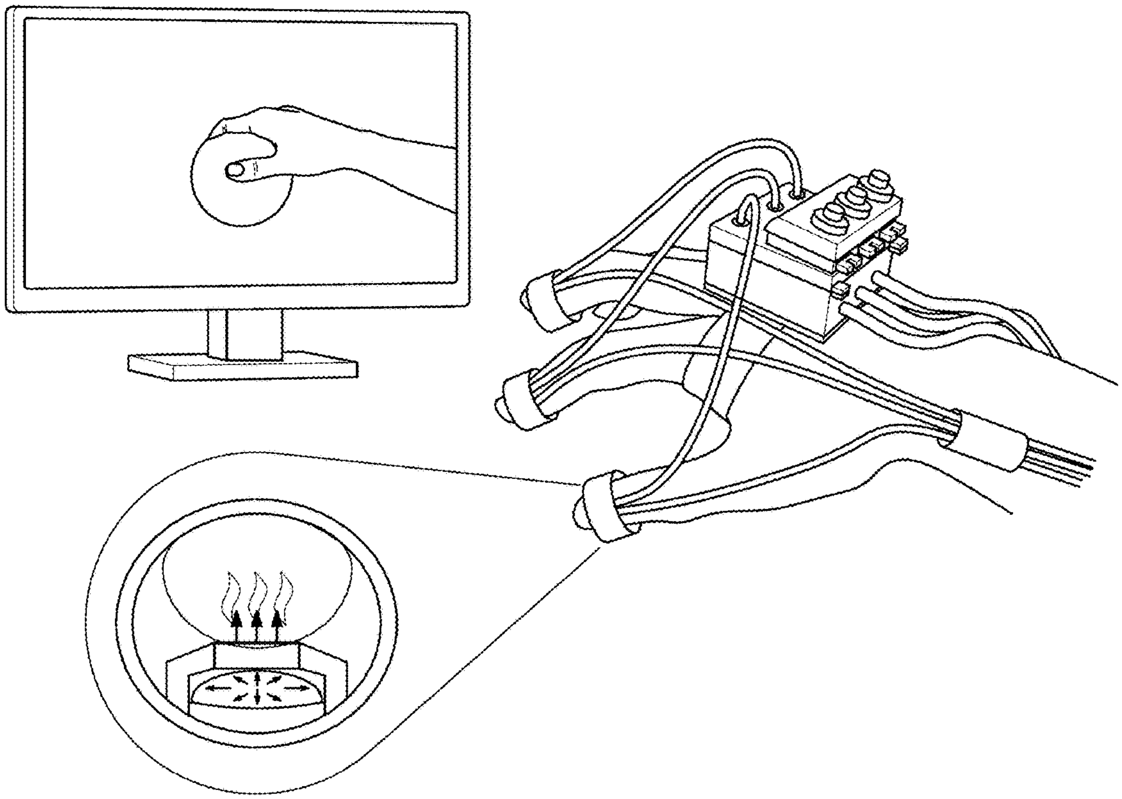
FIG. 1 is a perspective view of an interface device according to an example embodiment.

Disclosed hereinafter are exemplary embodiments of the present invention. Particular structural or functional descriptions provided for the embodiments hereafter are intended merely to describe embodiments according to the concept of the present invention. The embodiments are not limited as to a particular embodiment.

Various modifications and/or alterations may be made to the disclosure and the disclosure may include various example embodiments. Therefore, some example embodiments are illustrated as examples in the drawings and described in detailed description. However, they are merely intended for the purpose of describing the example embodiments described herein and may be implemented in various forms. Therefore, the example embodiments are not construed as limited to the disclosure and should be understood to include all changes, equivalents, and replacements within the idea and the technical scope of the disclosure.

Terms such as “first” and “second” may be used to describe various parts or elements, but the parts or elements should not be limited by the terms. The terms may be used to distinguish one element from another element. For instance, a first element may be designated as a second element, and vice versa, while not departing from the extent of rights according to the concepts of the present invention.

Unless otherwise clearly stated, when one element is described, for example, as being “connected” or “coupled” to another element, the elements should be construed as being directly or indirectly linked (i.e., there may be an intermediate element between the elements). Similar interpretation should apply to such relational terms as “between”, “neighboring,” and “adjacent to.”

Terms used herein are used to describe a particular exemplary embodiment and should not be intended to limit the present invention. Unless otherwise clearly stated, a singular term denotes and includes a plurality. Terms such as “including” and “having” also should not limit the present invention to the features, numbers, steps, operations, subparts and elements, and combinations thereof, as described; others may exist, be added or modified. Existence and addition as to one or more of features, numbers, steps, etc. should not be precluded.

Unless otherwise clearly stated, all of the terms used herein, including scientific or technical terms, have meanings which are ordinarily understood by a person skilled in the art. Terms, which are found and defined in an ordinary dictionary, should be interpreted in accordance with their usage in the art. Unless otherwise clearly defined herein, the terms are not interpreted in an ideal or overly formal manner.

Hereinafter, example embodiments will be described with reference to the accompanying drawings. However, the scope of the patent application is not limited to or restricted by such example embodiments. Like reference numerals used herein refer to like elements throughout.

FIG. 1 is a perspective view of an interface device according to an example embodiment.

Referring to FIG. 1, at least a portion of a (virtual reality (VR)) interface device is made of a soft material with flexibility, thereby providing a wearable interface device that a user may wear. Also, the interface device may interact with virtual reality (VR) to provide feedback for a thermal sensation and a touch sensation, that is, thermo-touch feedback to the user wearing the interface device. For example, when the user grabs a hot object in virtual reality (VR), the interface device may provide the user with a touch sensation that occurs at the moment of grabbing an object and a thermal sensation transmitted from the object at the same time.

The interface device may include at least one haptic feedback device, at least one pump configured to provide the air pressure to the haptic feedback device, and a control unit configured to control the operation of the haptic feedback device.

The haptic feedback device and/or the pump may be provided in numbers corresponding to the number of the user’s fingers. According to an example embodiment, the haptic feedback device and/or the pump may be provided only in numbers corresponding to a few (e.g., at least some of thumb, index finger, and middle finger) of the user’s fingers. However, the number of haptic feedback devices and the number of pumps are not necessarily the same, and the number of haptic feedback devices may be greater than the number of pumps. In this case, at least one haptic feedback device may not be provided with the air pressure, or at least two haptic feedback devices may be provided with the air pressure from a single pump.

The haptic feedback device may include a thermal sensation providing unit and a touch sensation providing unit, and the thermal sensation providing unit and the pump may perform a predetermined operation in response to a control signal received through a wire from the control unit. Also, the haptic feedback device may transmit detected temperature information to the control unit. For example, the control unit may transmit a control signal for generating the air pressure to the pump, may transmit, to the thermal sensation providing unit, a control signal for generating heat for thermal sensation provided to the user, and/or may receive measured temperature information from the thermal sensation providing unit. Also, the control unit may also perform a PID control using the received temperature information.

Figure 2:
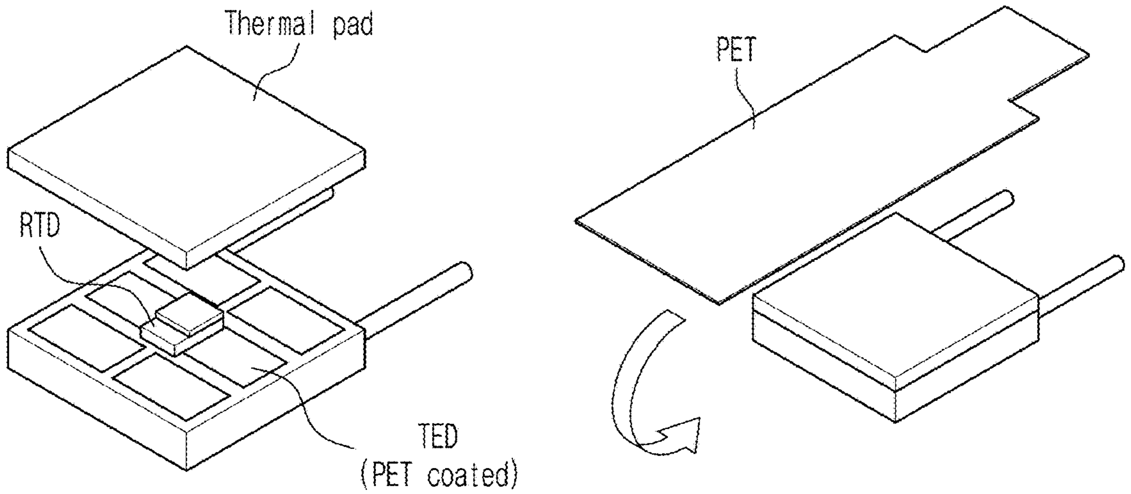
FIG. 2 is an exploded perspective view of a thermal sensation providing unit included in a haptic feedback device of FIG. 1.

FIG. 2 is an exploded perspective view of a thermal sensation providing unit included in a haptic feedback device of FIG. 1.

Referring to FIG. 2, the thermal sensation providing unit includes a substrate, at least one thermoelectric device (TED) formed on the substrate, and a thermal pad formed on the thermoelectric device.

At least one thermoelectric device (TED) may be implemented on the substrate to generate heat in response to a control signal received from the control unit. A plurality of thermoelectric devices (TEDs) may be implemented on the substrate. An exemplary thermoelectric device (TED) may be implemented in a rectangular parallelepiped shape with the width of 10 mm, the length of 10 mm, and the thickness of 2.3 mm, but the scope of the present invention is not limited to the size or the shape of the thermoelectric device. The size or the shape may vary depending on example embodiments.

An insulating film for insulation may be implemented on the thermoelectric device (TED). An exemplary insulating film may be a polyethylene terephthalate (PET) tape. That is, the PET tape may be attached to the thermoelectric device (TED) and may serve as the insulating film. According to an example embodiment, the PET tape with the thickness of 20 μm may be used. However, the scope of the present invention is not limited to the type of the insulating film or the thickness of the PET tape.

The thermal pad is a configuration for even heat transfer to the user (or the user's finger) and may be implemented in a rectangular parallelepiped shape with the width of 10 mm, the length of 10 mm, and the thickness of 1.0 mm, but the scope of the present invention is not limited to the size or the shape of the thermal pad. Also, the thermal pad may provide a thermal sensation and/or a touch sensation to the user in (direct) contact with at least a portion of the user's finger (e.g., fingertip of at least one finger or fingerprint-formed portion).

According to an example embodiment, the thermal sensation providing unit may further include at least one temperature detector. The temperature detector is a configuration for measuring the temperature corresponding to the thermal sensation provided to the user in real time or in non-real time and may be implemented as a resistance temperature detector (RTD). The temperature detector may be implemented between the at least one thermoelectric device and the thermal pad, and may measure the temperature of the thermoelectric device and/or thermal pad. An exemplary resistance temperature detector (RTD) may be implemented with the width of 2.0 mm, the length of 2.3 mm, and the thickness of 1.1 mm.

Components constituting the thermal sensation providing unit may be fixed by a predetermined fixing device. For example, the assembled thermal sensation providing unit may be fixed using the PET tape.

Also, each of the at least one thermoelectric device (TED) and the temperature detector (RTD) included in the thermal sensation providing unit may receive or transmit an electrical signal through a predetermined wire (, which may represent an electric wire). For example, the thermoelectric device (TED) may generate heat in response to a control signal of the control unit received through the wire, and the temperature detector may transmit detected temperature information to the control unit through the wire.

Figure 3:
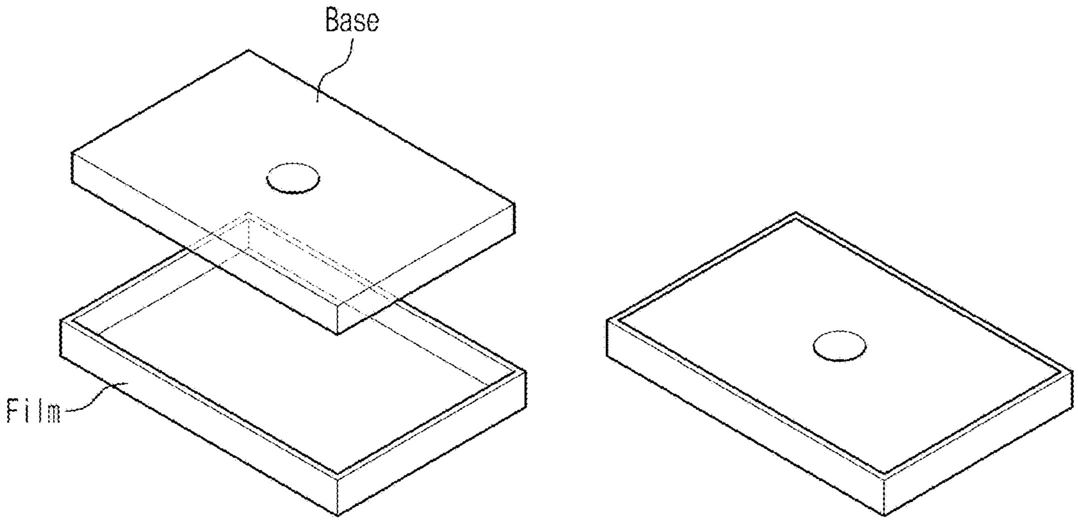
FIG. 3 is an exploded perspective view of a touch sensation providing unit included in the haptic feedback device of FIG. 1.

FIG. 3 is an exploded perspective view of the touch sensation providing unit included in the haptic feedback device of FIG. 1.

The touch sensation providing unit may be implemented in a polyhedral shape. For example, the touch sensation providing unit may be implemented in a rectangular parallelepiped shape. Here, to generate pneumatic actuation in only one direction, a base of the touch sensation providing unit may be made with an inelastic material, for example, polydimethylsiloxane (PDMS), and a film made with an elastic (or highly elastic) material, for example, Ecoflex (thin) may be added in a direction in which actuation occurs. Also, a predetermined hole to receive the air pressure may be provided to the base. The hole that penetrates the base may be implemented at the center or at a predetermined location of the base. The base has the width of 14 mm, the length of 9 mm, and the thickness of 2 mm, and the film is in a (rectangular) parallelepiped shape of which one side is empty (or of which one side is open) and has the thickness of 0.5 mm on every side. Here, the touch sensation providing unit may have an overall size of 15 mm in width, 10 mm in length, and 2.5 mm in thickness. As described above, through a touch sensation providing unit design without dead volume, the maximum pneumatic actuation may be output even with limited air pressure supply. The absence of the dead volume also contributes to reducing the thickness of a wearable haptic actuator, thereby enhancing comfort of wearing.

That is, the touch sensation providing unit may be in a shape of, for example, a polyhedron, and one side of the polyhedron may not be elastic, but the other side of may be elastic. Also, a predetermined hole may be provided on the inelastic surface to provide the air surface.

The touch sensation providing unit may be understood to include the inelastic base with the predetermined hole and the elastic film. The edge of the base and the film may be bonded such that the provided air pressure may not be leaked. Therefore, since the air pressure is provided through the hole in the base, the film attached to the base may elongate, providing the touch sensation.

Figure 4:
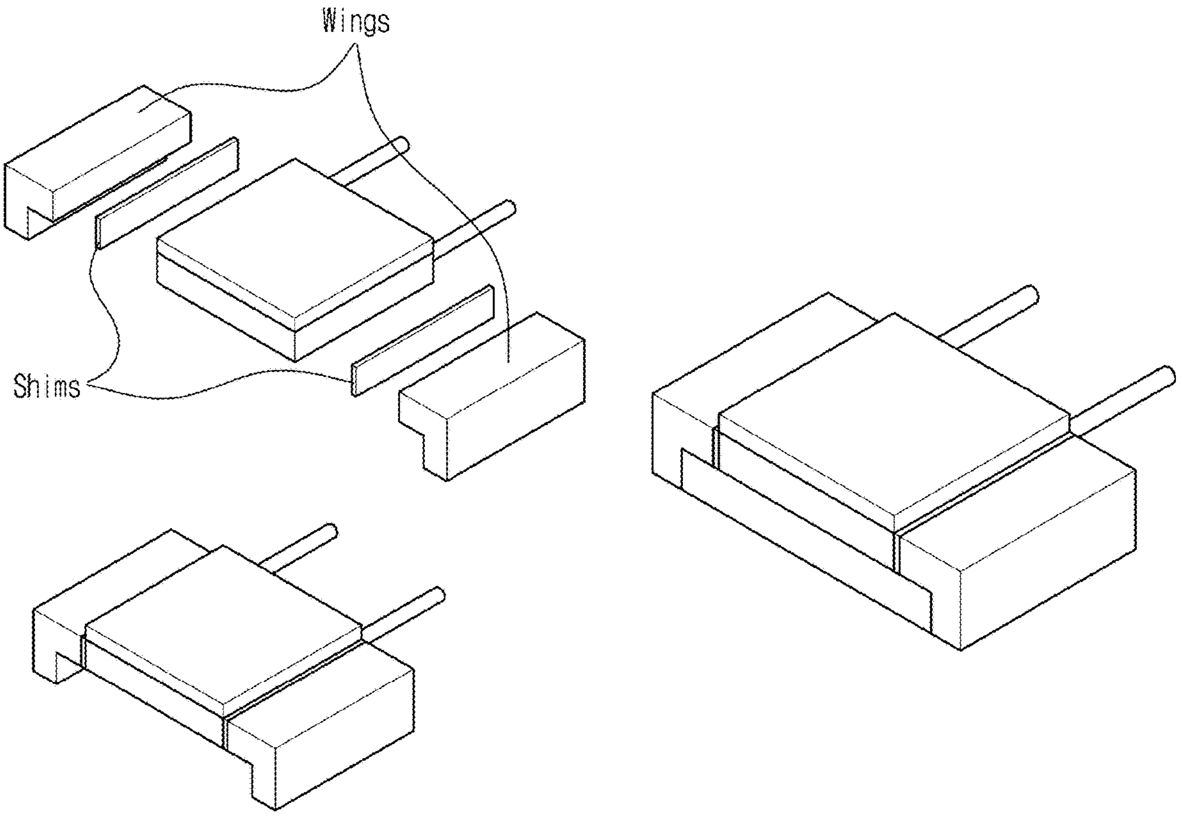
FIG. 4 is a perspective view of a haptic feedback device included in the interface device of FIG. 1.

FIG. 4 is a perspective view of the haptic feedback device of FIG. 1.

The haptic feedback device includes the touch sensation providing unit and the thermal sensation providing unit. The thermal sensation providing unit is provided on the top surface (, which may indicate the surface configured with the elastic film) of the touch sensation providing unit. Here, the length of the touch sensation providing unit and the length of the thermal sensation providing unit may be the same or different, but the width of the touch sensation providing unit and the width of the thermal sensation providing unit may be different. For example, the width of the touch sensation providing unit may be greater than the width of the thermal sensation providing unit. Therefore, although the thermal sensation providing unit is located on the top surface of the touch sensation providing unit, at least a portion (e.g., area by predetermined length from both side edges) on the top surface of the touch sensation providing unit may be exposed without being covered by the thermal sensation providing unit.

The haptic feedback device may include a fixing device. The fixing device may have a shape corresponding to a shape of the touch sensation providing unit and/or the thermal sensation providing unit to be in contact with the side of the touch sensation providing unit, an exposed portion of the top surface of the touch sensation providing unit due to absence of the thermal sensation providing unit, and the side of the thermal sensation providing unit. For example, the fixing device may have an L-shaped cross-section and may have the same length as the length of the touch sensation providing unit or the thermal sensation providing unit, and may be provided to each of both sides. That is, a total of two fixing devices may be provided. The fixing device may also be referred to as an extension wing depending on example embodiments. Also, the fixing device may be fixably attached to the side of the touch sensation providing unit and the side of the thermal sensation providing unit. Here, the top surface of the touch sensation providing unit and the fixing device may be in contact, but not bonded, so may elongate according to a change in the shape of the touch sensation providing unit to transmit pneumatic actuation to the thermal sensation providing unit. The fixing device may be made of elastic silicone, for example, Ecoflex. According to an example embodiment, shims may be formed between the fixing device and the thermal sensation providing unit. The shims may function as a bonding device configured to bond the fixing device and the thermal sensation providing device.

Here, the top surface of the touch sensation providing unit may represent the elastic surface, and the inelastic surface provided with the predetermined hole may represent the bottom surface. Therefore, the thermal sensation providing unit may be positioned on the elastic surface of the touch sensation providing unit.

As another example, the width of the touch sensation providing unit and the width of the thermal sensation providing unit may be the same. In this case, the fixing device may be fixably attached to at least a portion of the side of the touch sensation providing unit and to at least a portion of the side of the thermal sensation providing unit.

Also, the haptic feedback device may be worn on the user's finger through the fixing device. Here, the haptic feedback device may be worn such that the thermal sensation providing unit of the haptic feedback device may come into contact with the user's finger (fingertip or fingerprint-formed portion). Therefore, the heat generated by the thermal sensation providing unit may be transmitted to the user's finger. Also, the elongation of the film included in the touch sensation providing unit applies the pressure to the thermal sensation providing unit, and this pressure may be transmitted to the user's finger, providing a touch sensation.

Figure 5:
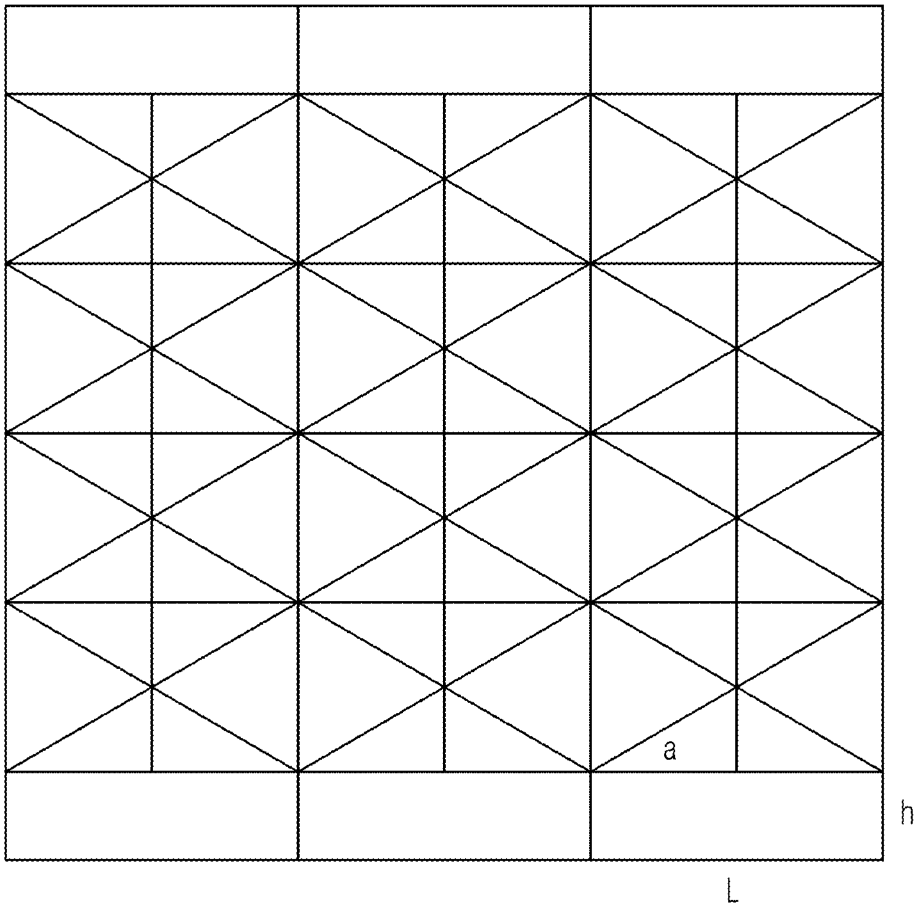
FIG. 5 illustrates an origami pattern of an origami pump to provide the air pressure to the touch sensation providing unit of FIG. 3.

FIG. 5 illustrates an origami pattern of an origami pump to provide the air pressure to the touch sensation providing unit of FIG. 3. FIG. 5 illustrates Yoshimura origami pattern on which the origami pump is based. An exemplary origami pattern is L=10 mm, a=30°, and h=3 mm. However, the scope of the present invention is not limited to the origami pattern, and the figure may vary depending on example embodiments.

Figure 6:
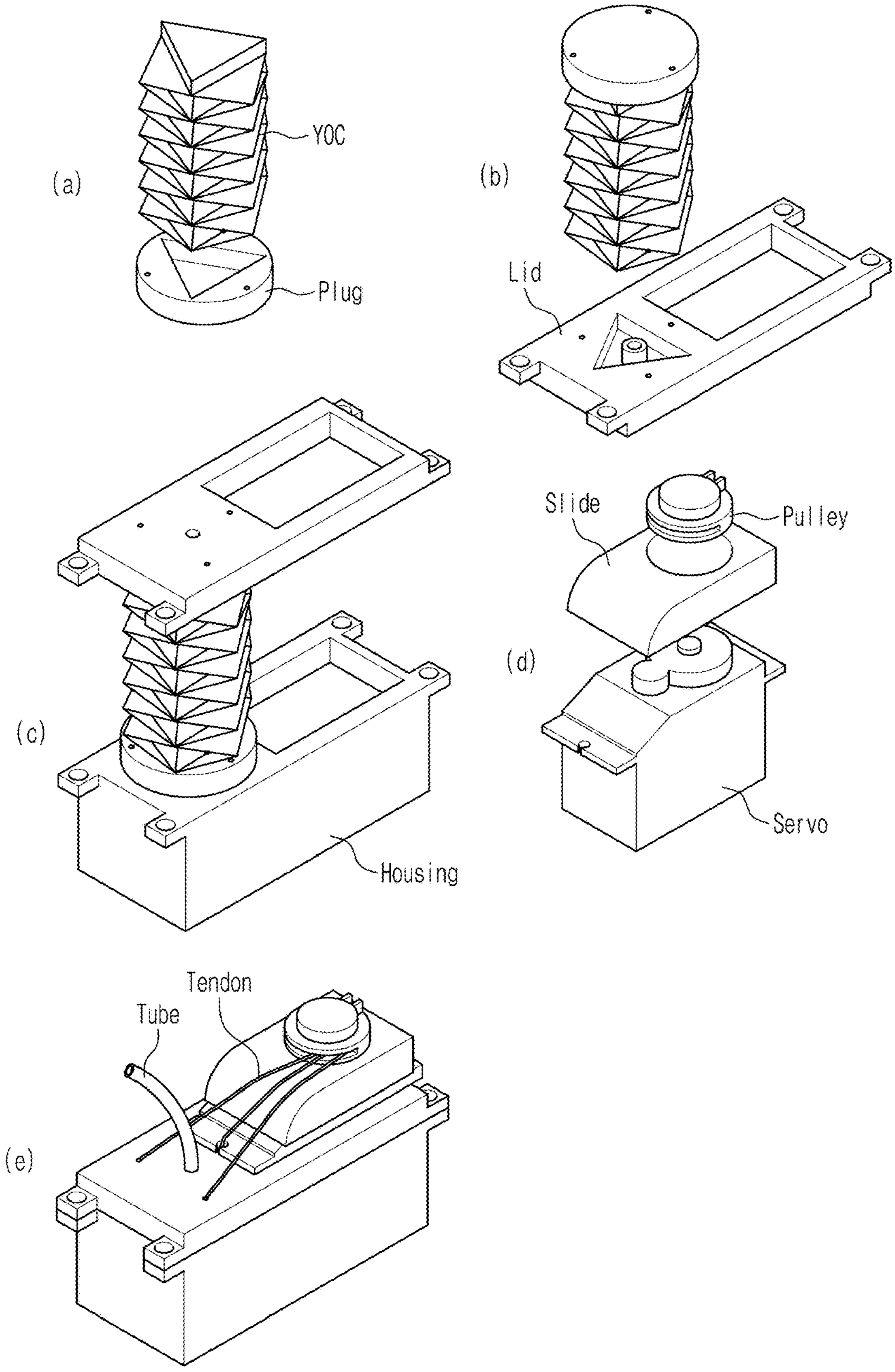
FIG. 6 illustrates an origami pump manufactured based on the origami pattern of FIG. 5.

FIG. 6 illustrates an origami pump manufactured based on the origami pattern of FIG. 5.

The origami pump of FIG. 6 is controlled by a servo motor connected to a tendon.

A Yoshimura origami cylinder (YOC) manufactured based on the origami pattern of FIG. 5 is connected to, for example, a plug with a 3 mm-deep triangular blind hole (or groove) and having the diameter of 14 mm and the height of 4 mm, and sealed. That is, a receiving groove for accommodating at least a portion of the origami cylinder may be provided in the plug.

The opposite side of the Yoshimura origami cylinder (YOC) (, which may represent an end opposite to an end that is accommodated in the plug,) is connected and sealed to a 3 mm-deep triangular blind hole in a lid with the width of 17 mm, the length of 42 mm, and the height of 4 mm. That is, the lid may be provided with a receiving groove for accommodating at least a portion of the origami cylinder. Also, the lid may be provided with a receiving portion configured to receive the servo motor, separate by a predetermined distance from the portion to which the origami cylinder is mounted. That is, the lid may be provided with the receiving groove configured to sequentially mount the origami cylinder in the longitudinal direction and the receiving portion configured to sequentially accommodate the servo motor. The receiving portion may refer to an opening having a corresponding shape to accommodate the servo motor (Servo).

The Yoshimura origami cylinder (YOC) with both sides joined is inserted into a blind hole with the diameter of 5 mm and the depth of 16 mm of a housing with the width of 17 mm, the length of 42 mm, and the height of 17 mm (excluding screw joint).

The servo motor (Servo) with the tendon connected is mounted to the square-shaped blind hole that penetrates the lid and the housing. That is, the housing may be provided with a receiving portion (blind hole) configured to accommodate the servo motor (Servo) at a location corresponding to the receiving portion of the lid.

The rotation of the servo motor (Servo) pulls the tendon, which, in turn, pulls the plug on the bottom of the Yoshimura origami cylinder (YOC), compressing the origami cylinder and supplying the air pressure. To this end, the lid is provided with at least one hole through which the tendon passes. According to an example embodiment, three holes may be provided and may be provided at intervals of 120 degrees based on the axis of the origami cylinder. The tendon that passes through the hole in the lid may be fixed on a corresponding location of the plug.

The air pressure generated due to compression of the plug is provided to the touch sensation providing unit through a tube. That is, the tube may be provided with the air pressure from the cylinder through the hole formed in the lid, and may provide the air pressure to the touch sensation providing unit through the hole formed in the base of the touch sensation providing unit. To this end, the lid may be provided with the hole for providing the air pressure from the origami cylinder to the pump. The tube may be attached to the hole in the lid, or may be inserted into the hole in the lid. Likewise, the tube may be attached to the hole in the touch sensation providing unit or may be inserted into the hole in the touch sensation providing unit. Both ends of the tube may be sealed to prevent the air pressure from leaking. Also, at least one tendon may be provided, and one end thereof may be connected to a rotation shaft of the servo motor and the other end thereof may be connected to the plug. For example, three tendons may be implemented.

The manufactured origami pump has a size that may be worn on the back of the user's hand. For example, the origami pump may be attached to a glove fitted on the user's hand.

Figure 7:
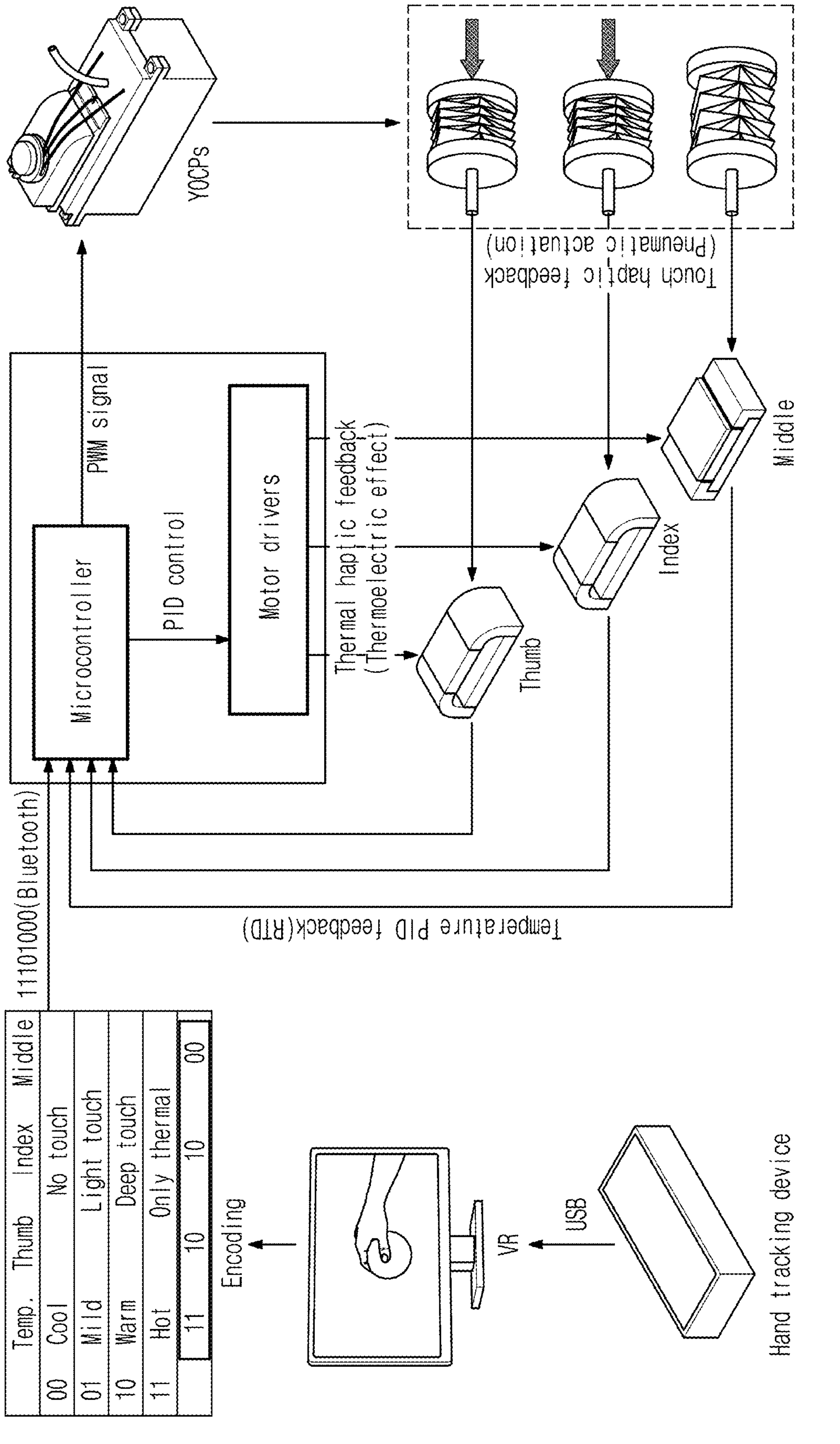
FIG. 7 illustrates an interface system including the interface device of FIG. 1.

FIG. 7 illustrates an interface system including the interface device of FIG. 1.

FIG. 7 illustrates the interface system that includes the interface device configured to provide thermo-touch haptic feedback in conjunction with virtual reality (VR). A hand tracking device tracks the motion of a real user hand. Data on the tracked hand motion is transmitted to a computing device through a predetermined wired/wireless communication network (e.g., USB). Using the data, real-time skeleton animation for a virtual hand is implemented in virtual reality (VR) developed based on a predetermined language (e.g., C++). A physical engine is applied to the virtual reality (VR) to enable physical interaction between the virtual hand and the virtual object. The physical interaction between the virtual hand and the virtual object is encoded as data of a predetermined size (e.g., 1 byte) depending on cases. The temperature of the object may be encoded to a plurality of states, for example, four states: cool (00), mild (01), warm (10), and hot (11). In the case of the intensity of physical interaction acting on at least one of the thumb, index finger, and middle finger, it may be encoded to four cases, for example, no touch (00), light touch (01), deep touch (10), and only thermal (11). The example given in FIG. 7 is a state when strongly pinching the hot object with only the thumb and the index finger, data for this situation may be encoded as 1 byte of 11101000. The encoded data may be (wirelessly) transmitted to a microcontroller of an embedded board through predetermined wired/wireless communication (e.g., serial communication of Bluetooth), and the microcontroller may decode the data again. The actual temperature corresponding to each temperature (cool, mild, worm, and hot) may be determined by the embedded system. The intensity of touch (no touch, light touch, and deep touch) may be determined by the embedded system, and may correspond to a rotation angle of the servo motor.

Figure 8:
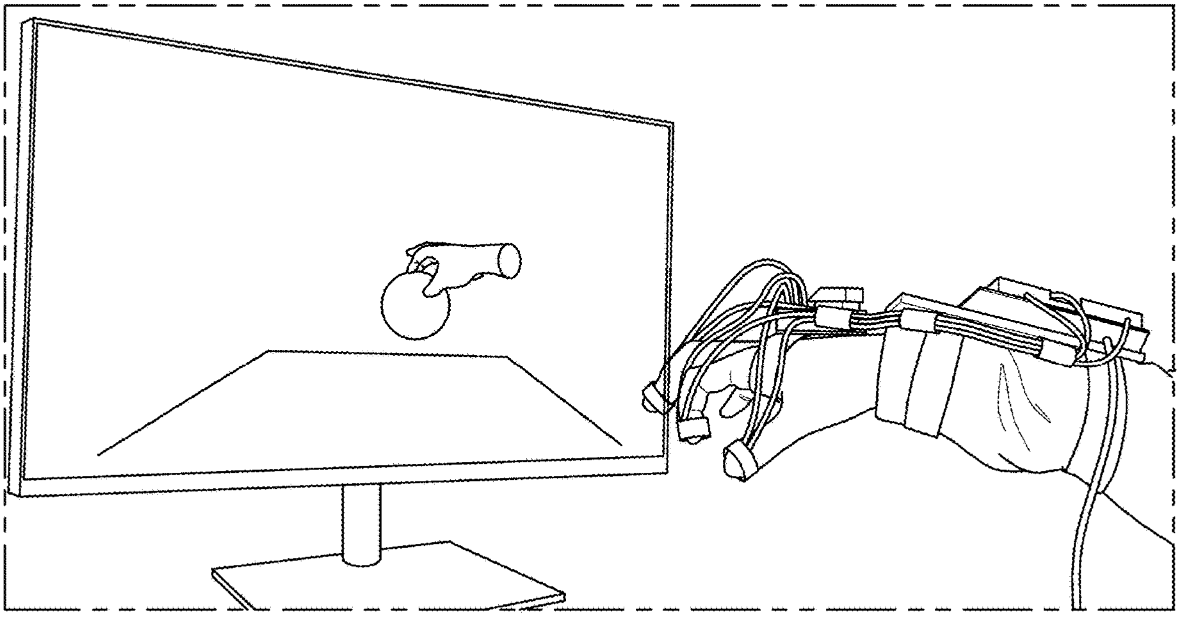
FIG. 8 shows an overall operation of the interface.

FIG. 8 shows an overall operation of the interface.

In virtual reality (VR), the virtual hand moves with high accuracy according to the motion of the real hand, and it can be seen that, when the virtual object is pinched, the virtual object is well held in the hand. FIG. 8 shows an example of a case in which the hot object is pinched with the thumb and the index finger. At this example, the temperature of the middle finger not in contact with the object does not change and only the temperature of the thumb and the index finger increases by the temperature of the object. The temperature changes of the thumb, index finger, and middle finger are shown in detail in FIG. 10. Also, the temperature may be controlled based on PID control to ensure that the temperature of the device does not indefinitely increase but remains at the same level.

Figure 9:
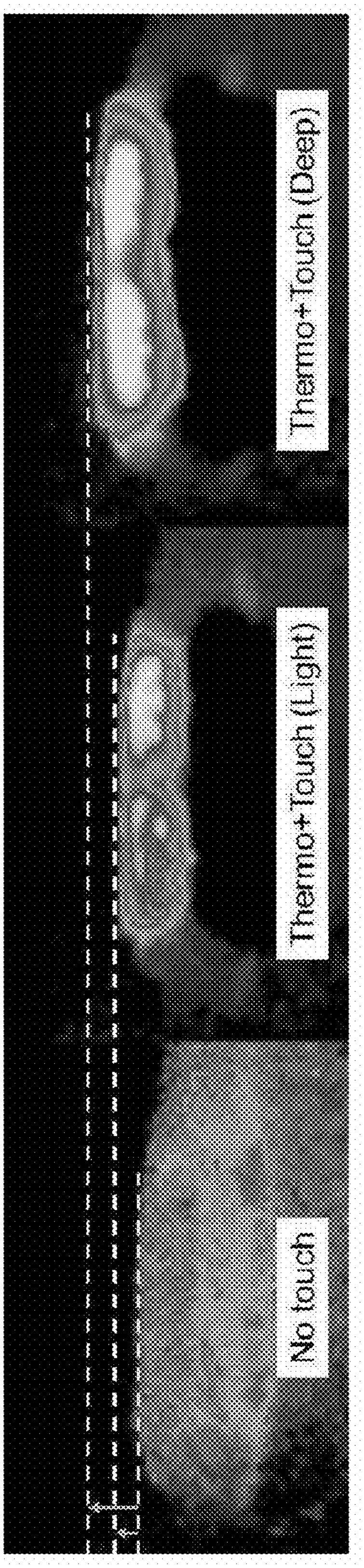
FIG. 9 illustrates an operation of a thermo-touch haptic feedback actuator captured by a thermal imaging camera.

FIG. 9 illustrates an operation of a thermo-touch haptic feedback actuator captured by a thermal imaging camera.

When the hand contacts the hot object in virtual reality (VR), the thermoelectric device (TED) is heated and, at the same time, the pneumatic actuator (touch sensation providing unit) below inflates. That is, haptic feedback for heat and touch may be simultaneously generated.

Figure 10:
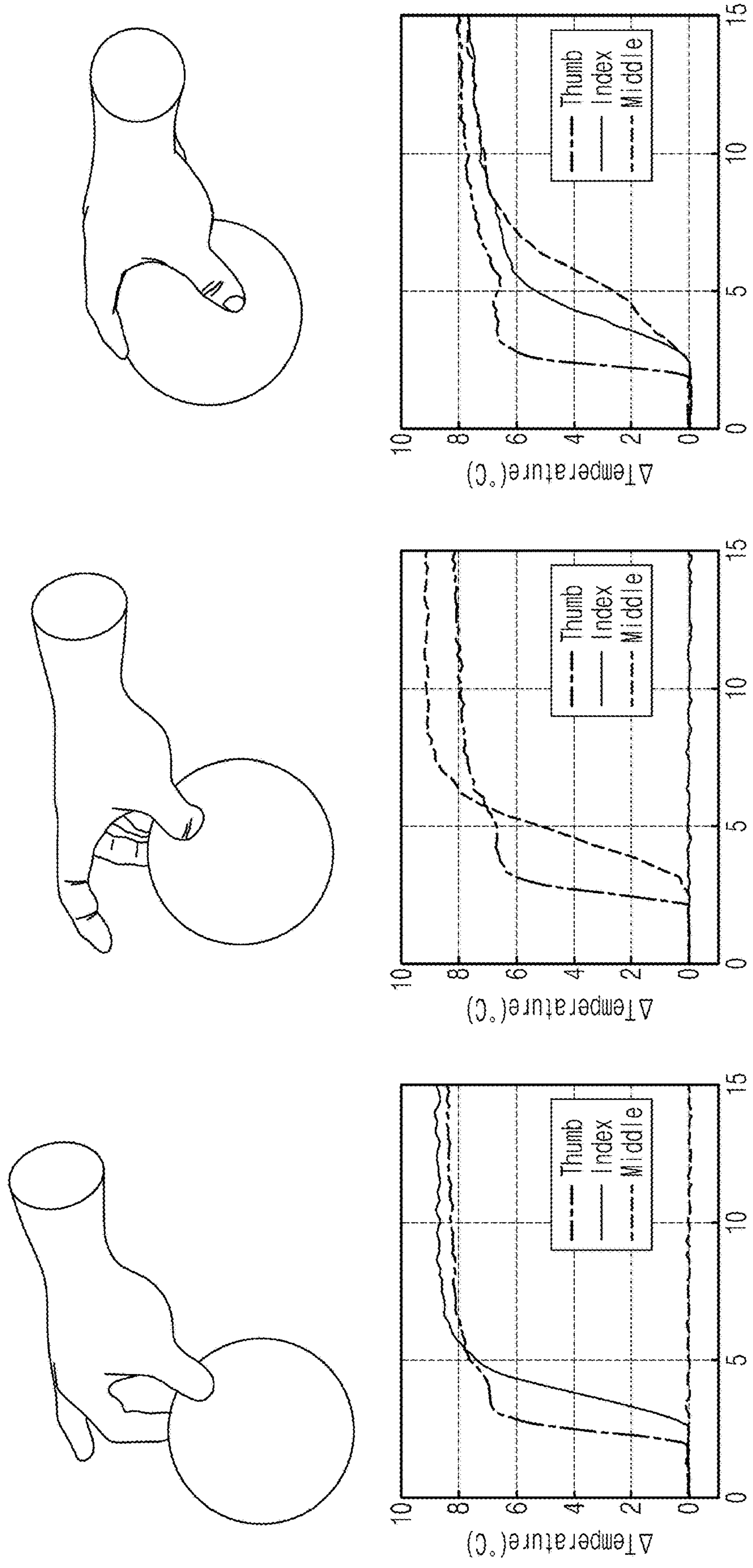
FIG. 10 shows a change in temperature of a device worn on each finger when contacting a hot object in virtual reality.

FIG. 10 shows a change in temperature of the device worn on each finger when contacting the hot object in virtual reality.

From left to right, postures are pinching with the thumb and the index finger, pinching with the thumb and the middle finger, and grabbing in the hand. Graphs of FIG. 10 show the change in temperature of each finger device and it can be observed that only the temperature of the finger pinching the object increases in each situation.

The device described above can be implemented as hardware elements, software elements, and/or a combination of hardware elements and software elements. For example, the device and elements described with reference to the embodiments above can be implemented by using one or more general-purpose computer or designated computer, examples of which include a processor, a controller, an ALU (arithmetic logic unit), a digital signal processor, a microcomputer, an FPGA (field programmable gate array), a PLU (programmable logic unit), a microprocessor, and any other device capable of executing and responding to instructions. A processing device can be used to execute an operating system (OS) and one or more software applications that operate on the said operating system. Also, the processing device can access, store, manipulate, process, and generate data in response to the execution of software. Although there are instances in which the description refers to a single processing device for the sake of easier understanding, it should be obvious to the person having ordinary skill in the relevant field of art that the processing device can include a multiple number of processing elements and/or multiple types of processing elements. In certain examples, a processing device can include a multiple number of processors or a single processor and a controller. Other processing configurations are also possible, such as parallel processors and the like.

The software can include a computer program, code, instructions, or a combination of one or more of the above and can configure a processing device or instruct a processing device in an independent or collective manner. The software and/or data can be tangibly embodied permanently or temporarily as a certain type of machine, component, physical equipment, virtual equipment, computer storage medium or device, or a transmitted signal wave, to be interpreted by a processing device or to provide instructions or data to a processing device. The software can be distributed over a computer system that is connected via a network, to be stored or executed in a distributed manner. The software and data can be stored in one or more computer-readable recorded medium.

A method according to an embodiment of the invention can be implemented in the form of program instructions that may be performed using various computer means and can be recorded in a computer-readable medium. Such a computer-readable medium can include program instructions, data files, data structures, etc., alone or in combination. The program instructions recorded on the medium can be designed and configured specifically for the present invention or can be a type of medium known to and used by the skilled person in the field of computer software. Examples of a computer-readable medium may include magnetic media such as hard disks, floppy disks, magnetic tapes, etc., optical media such as CD-ROM's, DVD's, etc., magneto-optical media such as floptical disks, etc., and hardware devices such as ROM, RAM, flash memory, etc., specially designed to store and execute program instructions. Examples of the program instructions may include not only machine language codes produced by a compiler but also high-level language codes that can be executed by a computer through the use of an interpreter, etc. The hardware mentioned above can be made to operate as one or more software modules that perform the actions of the embodiments of the invention and vice versa.

Although the present invention is described with reference to the example embodiments illustrated in the drawings, it is provided as an example only and it will be apparent to one of ordinary skill in the art that various alterations and modifications in form and details may be made in these example embodiments without departing from the spirit and scope of the claims and their equivalents. For example, suitable results may be achieved if the described techniques are performed in a different order, and/or if components in a described system, architecture, device, or circuit are combined in a different manner, and/or replaced or supplemented by other components or their equivalents. Therefore, other implementations, other example embodiments, and equivalents are within the scope of the following claims.

What is claimed is:

1. A haptic feedback device comprising:

a thermal sensation providing unit configured to provide a thermal sensation to a user;

a touch sensation providing unit configured to provide a touch sensation to the user, wherein the thermal sensation providing unit is provided on a top surface of the touch sensation providing unit; and a fixing device configured to fix at least a portion of the thermal sensation providing unit and at least a portion of the touch sensation providing unit, wherein the thermal sensation providing unit includes:

a substrate;

at least one thermoelectric device (TED) formed on the substrate; and a thermal pad formed on the at least one thermoelectric device (TED), and the touch sensation providing unit includes:

a base with a hole formed; and a film configured to bond to the base and to elongate according to air pressure provided through the hole.

2. The haptic feedback device of claim 1, wherein:

the thermal sensation providing unit and the touch sensation providing unit are in a rectangular parallelepiped shape, the width of the touch sensation providing unit is greater than the width of the thermal sensation providing unit, a first fixing device of the fixing device is in contact with one side of the touch sensation providing unit, a top surface portion of one side of the touch sensation providing unit in an exposed portion of the top surface of the touch sensation providing unit due to absence of the thermal sensation providing unit, and one side of the thermal sensation providing unit, the first fixing device is attached to one side of the touch sensation providing unit and one side of the thermal sensation providing unit, a second fixing device of the fixing device is in contact with an other side of the touch sensation providing unit, a top surface portion of the other side of the touch sensation providing unit in the exposed portion of the top surface of the touch sensation providing unit due to absence of the thermal sensation providing unit, and an other side of the thermal sensation providing unit, the second fixing device is attached to the other side of the touch sensation providing unit and the other side of the thermal sensation providing unit, and the first fixing device and the second fixing device are elastic.

3. The haptic feedback device of claim 2, wherein the thermal sensation providing unit further includes a temperature detector formed between the thermoelectric device and the thermal pad.

4. The haptic feedback device of claim 2, wherein the base of the touch sensation providing unit is made with polydimethylsiloxane (PDMS), and the film is made with a highly elastic thin material.

5. The haptic feedback device of claim 4, wherein the thermal sensation providing unit is formed on the film of the touch sensation providing unit.

6. The haptic feedback device of claim 5, wherein the thermoelectric device (TED) generates heat in response to a control signal received through a wire, the film of the touch sensation providing unit elongates in response to air pressure formed on the base, according to the elongation of the film, the first fixing device and the second fixing device elongate.

7. An interface device comprising:

a haptic feedback device of claim 1;

a pump configured to provide air pressure to the touch sensation providing unit of the haptic feedback device; and a control unit configured to output a control signal for controlling the thermal sensation providing unit and a control signal for controlling the pump.

8. The interface device of claim 7, wherein:

the pump generates air pressure in response to the control signal received from the control unit, and the generated air pressure is provided to the touch sensation control unit through a tube and through the hole in the touch sensation control unit.

9. The interface device of claim 7, wherein the pump includes:

a servo motor; an an origami cylinder configured to compress or expand according to an operation of the servo motor.

* * * * *